(12) United States Patent
Takeuchi et al.

(10) Patent No.: US 6,203,250 B1
(45) Date of Patent: Mar. 20, 2001

(54) ARTICLE FEEDING APPARATUS

(75) Inventors: Yukihisa Takeuchi, Nishikamo-gun; Hiroyuki Tsuji, Nagoya; Takao Ohnishi, Nishikasugai-gun, all of (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 09/212,342

(22) Filed: Dec. 15, 1998

(30) Foreign Application Priority Data

Dec. 16, 1997 (JP) .................................................. 9-346839

(51) Int. Cl.[7] .................................................. B65G 53/16
(52) U.S. Cl. ........................ 406/88; 406/168; 414/676
(58) Field of Search .......................... 406/83, 86, 88, 406/168; 414/676

(56) References Cited

U.S. PATENT DOCUMENTS

| | | | |
|---|---|---|---|
| 3,473,910 | * 10/1969 | Wilde et al. ........................ | 65/182 |
| 3,731,823 | * 5/1973 | Goth ........................................ | 198/35 |
| 3,946,854 | * 3/1976 | Kojima et al. ........................ | 198/21 |
| 4,978,253 | * 12/1990 | Lazzari .................................. | 406/88 |
| 5,634,636 | * 6/1997 | Jackson et al. ........................ | 406/88 |
| 5,655,646 | * 8/1997 | Soderlund et al. .................. | 198/841 |

* cited by examiner

*Primary Examiner*—Christopher P. Ellis
*Assistant Examiner*—Joe Dillon, Sr.
(74) *Attorney, Agent, or Firm*—Burr & Brown

(57) ABSTRACT

An apparatus for feeding semiconductor chips has a structural body having grooves which serve respectively as parallel feed paths for semiconductor chips, the feed paths corresponding to respective quality levels of the semiconductor chips, the structural body being made of partially stabilized zirconia. A stopper mechanism for temporarily stopping semiconductor chips fed along the feed paths comprises piezoelectric bodies disposed in the feed paths in front of terminal walls of the feed paths. A counter mechanism for counting semiconductor chips fed along the feed paths have electrodes disposed in the feed paths near the terminal walls. The apparatus serves as a feed system for floating articles with ejected air and feeding the floated articles, and lends itself to being automatized.

1 Claim, 7 Drawing Sheets

ARTICLE FEEDING APPARATUS

BACKGROUND OF THE INVENTION

1. Field of the Invention

The present invention relates to an article feeding apparatus for feeding articles (various electronic parts such as semiconductor chips) being fabricated to a next manufacturing process or feeding completed articles to a next assembling process.

2. Description of the Related Art

Generally, production lines for articles (various electronic parts such as semiconductor chips) often employ containers in the form of upwardly open boxes for feeding a number of articles to a next fabrication process or a storage chamber.

For feeding a number of electronic parts (hereinafter also referred to as "workpieces") with a container along a production line, the workpieces are randomly placed into the container, and the container is automatically delivered to a next fabrication process or a storage chamber by a belt conveyor or a feed arm.

If articles to be fed are small-size articles such as electronic parts, then it is known to employ a feed path having a number of small holes and ejecting air through these holes to feed the articles.

According to the air-feeding process, a number of small-size articles can smoothly be fed to a destination within a reduced period of time while reducing foreign matter which would otherwise tend to be attached to the articles.

The air-feeding process is carried out by a feeding apparatus which is usually made of a metal such as aluminum or steel to meet robustness requirements of the feeding apparatus. However, it is not easy to form small air-ejection holes in the metal panel of the feed path for controlling a floated state of small articles to be fed. When the feeding apparatus is used for a long period of time, the feed path, which is in the form of a groove, tends to be worn, and particles abraded off the feed path are liable as foreign matter to the articles being fed.

SUMMARY OF THE INVENTION

It is therefore an object of the present invention to provide an article feeding apparatus which has an automatized feed system for floating and feeding articles of small dimensions in one direction with air, and which can handle articles in a clean state without producing foreign matter such as small dust particles.

According to the present invention, there is provided an apparatus for floating articles with ejected air and feeding the floated articles, comprising at least one feed path for feeding articles therealong in a feed direction, the feed path comprising a groove, a first layer having side walls of the groove, a second layer serving as a bottom wall of the groove and having a plurality of air ejection holes defined therein, a third layer having an air distribution passage for distributing air to the air ejection holes, and a fourth layer serving as a bottom surface of the air distribution passage, at least the second layer being made of a ceramic material. The ceramic material should preferably be, but not necessarily limited to, partially stabilized zirconia for its strength. The apparatus serves as a feed system for floating articles with ejected air and feeding the floated articles, and lends itself to being automatized.

Since the ceramic material can easily be shaped highly accurately when formed, a plurality of small fluid ejection holes each having a diameter ranging from several tens to several hundreds $\mu$m can be defined in the second layer for floating and feeding articles of small dimensions. It is preferable to provide at least three fluid ejection holes per feed area corresponding to one article.

If the first layer having side walls of the groove is made of a ceramic material, then it can be shaped accurately to small dimensions. For example, if semiconductor chips each of a square shape having a size of about 0.2 mm×0.2 mm is to be fed, then grooves as feed paths can be defined in the first layer at a small pitch of about 0.5 mm. The article feeding apparatus may be small in size. If an insulative ceramic material is used, then electrodes may easily be formed on the layers by printing or the like.

All the layers including the third and fourth layers may be formed of a ceramic material. For example, if all the layers are formed and sintered separately and then bonded into a unitary assembly, then the unitary assembly is free of problems such as of warpage or the like due to thermal expansion and shrinkage which would otherwise occur if the layers are made of different materials. Alternatively, formed sheets of the layers may be laminated together and then sintered. This latter process is preferable because no bonding process is required and the layers can be manufactured inexpensively and handled cleanly.

In the article feeding apparatus, furthermore, the first layer may preferably be made of glass or synthetic resin. If electrodes of a metal material are formed on the surface of the second layer which has been formed and sintered, the first layer to be placed on the second layer and then sintered needs to be sintered at a temperature lower than the melting point of the second layer if the second layer is made of a ceramic material. In view of this limitation, it is preferable to make the first layer of glass or synthetic resin which has a low melting point, and to print or coat a sheet of the first layer on the second layer on which electrodes have been printed, and then sinter the sheet of the first layer. Making the first layer of glass is preferable because it is resistant to wear. The application of a sheet of the first layer to the second layer is not limited to the printing or coating process, but may be carried out by bonding a formed sheet of glass or synthetic resin to the second layer with an adhesive. The glass or synthetic resin is not limited to any particular type.

The article feeding apparatus also has a stopper mechanism a stopper mechanism positioned at a terminal end of the feed path, for temporarily stopping an article fed along the feed path, the stopper mechanism having at least a pair of piezoelectric bodies. The piezoelectric bodies have upper ends held at a height slightly lower than the height to which the articles are floated. When a voltage is applied to the first piezoelectric body, it is deformed to lift its upper end to such a height that the first piezoelectric body becomes a barrier in the feed path. An article (first article) which has been fed hits the barrier and is temporarily stopped. Thereafter, the applied voltage is removed to allow the stopped article to be fed to a downstream unloading position at the terminal end of the feed path where the article will be unloaded. The second piezoelectric body is positioned upstream of the first piezoelectric body, and temporarily stops a next article (second article) positioned behind (upstream of) the first article. One or more second piezoelectric body may further be provided upstream.

In conventional apparatus for feeding articles with air, since air is ejected to feed the articles in one direction with no control effected on the articles being fed, articles tend to be held closely against each other at the terminal end of the feed path and hence cannot easily be unloaded. Therefore, it has been customary to unload semiconductor chips individually manually from the conventional apparatus, and the feed system of the conventional apparatus cannot be fully automatized.

According to the present invention, as described above, a voltage is applied to the first piezoelectric body to reliably stop a first article temporarily, and then removed to allow only the stopped article to be fed to the downstream unloading position. When only the first article is fed downstream to the unloading position, a voltage is applied to the second piezoelectric body positioned upstream of the first piezoelectric body for thereby decelerate and stop the second article, which is thus prevented from being continuously fed into overlapping relation to the first article. Consequently, the first article can easily be unloaded at the unloading position.

The article feeding apparatus further comprises a counter mechanism disposed in the feed path, for counting articles fed along the feed path, the counter mechanism having electrodes for detecting a change in a voltage which is produced by a change in an electrostatic capacitance between the electrodes when an article passes over the electrodes. Count information from the counter mechanism is used to automatize the article feeding apparatus.

Usually, the article feeding apparatus has as many grooves as the number of quality levels of articles to be fed, for use as feed paths. If these feed paths are associated with respective article unloading units, then suitable counter mechanisms may be combined with the respective article unloading units. However, facility cost and installation space considerations have prevented the feed paths from being associated with respective article unloading units, but have actually allowed the feed paths to share one or few article unloading units. Accordingly, articles belonging to the respective quality levels cannot individually be counted. According to the present invention, however, a voltage is continuously applied between the electrodes of the counter mechanism, and the electrostatic capacity between the electrodes varies depending on whether an article passes over the electrodes or not. Such a variation of the electrostatic capacity is detected as a voltage change. Since the electrodes can easily be provided in each of the feed paths, articles belonging to the respective quality levels can individually be counted with ease. If the counter mechanism is positioned at an intermediate position in each of the feed paths, then the counter mechanism may be used as a sensor for detecting when a certain number of articles remain stagnant between the unloading position and the intermediate position.

While being fed along the feed path, the preceding first article is constantly pushed by and held against the following second article, and hence these articles cannot reliably be distinguished by the counter mechanism. Therefore, the counter mechanism is placed in the unloading position at the terminal end of the feed path where the preceding first article is reliably separated from the following second article. The counter mechanism thus positioned is effective in counting articles fed along the feed path, without fail.

The above and other objects, features and advantages of the present invention will become more apparent from the following description when taken in conjunction with the accompanying drawings in which preferred embodiments of the present invention are shown by way of illustrative example.

DESCRIPTION OF THE PREFERRED EMBODIMENTS

Figure 1:
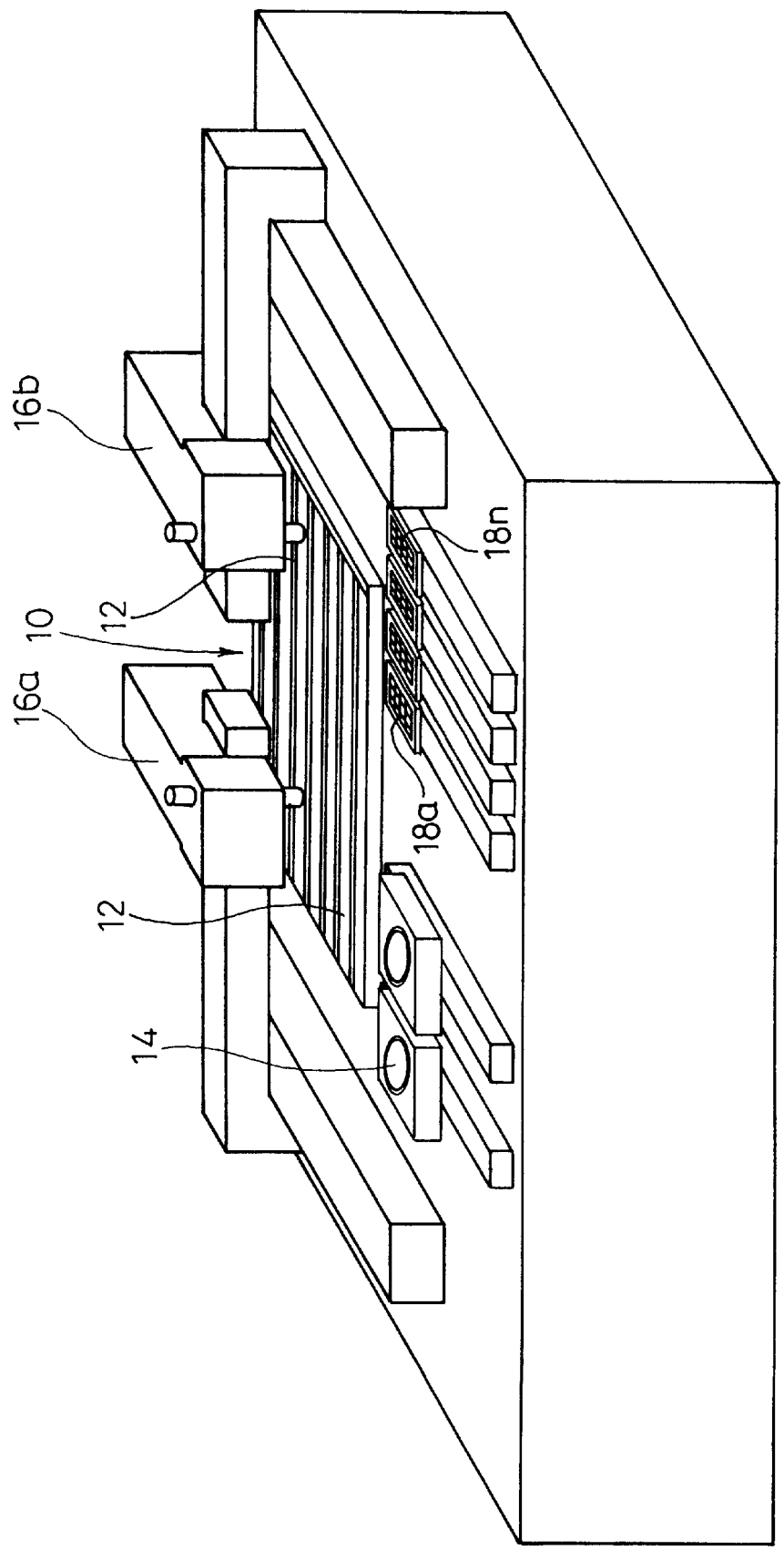
FIG. 1 is a perspective view of an article feeding apparatus according to the present invention.

As shown in FIG. 1, an article feeding apparatus 10 has a plurality of parallel grooves serving as feed paths 12 for feeding a number of semiconductor chips. The article feeding apparatus 10 has a structural body made of partially stabilized zirconia (PSZ), which includes a region where the above grooves are defined.

The article feeding apparatus 10 serves to sort out semiconductor chips according to their quality level. Specifically, after semiconductor chips on wafers 14 are inspected for quality, the wafers 14 are carried to the article feeding apparatus 10, and the semiconductor chips are attracted one at a time under vacuum by a robot 16a. Each of the semiconductor chips is delivered by the robot 16a to one of the feed paths 12 depending on the quality level of the semiconductor chip. Therefore, each of the feed paths 12 is loaded with and feeds successive semiconductor chips of a certain quality level. The semiconductor chips that have arrived at the terminal ends of the feed paths 12 are attracted under vacuum by a robot 16b, and carried to and placed in cases 18a–18n assigned to the respective quality levels. Thereafter, the cases 18a–18n are delivered to a next process.

The article feeding apparatus 10 basically comprises a mechanism for floating charged semiconductor chips, a mechanism (propelling mechanism) for feeding floated semiconductor chips in a feed direction along the feed paths 12, and a mechanism for reliably removing semiconductor chips one at a time from the terminal end of each of the feed paths 12. One of the feed paths 12, which are identical to each other, is illustrated in FIG. 2.

Figure 2:
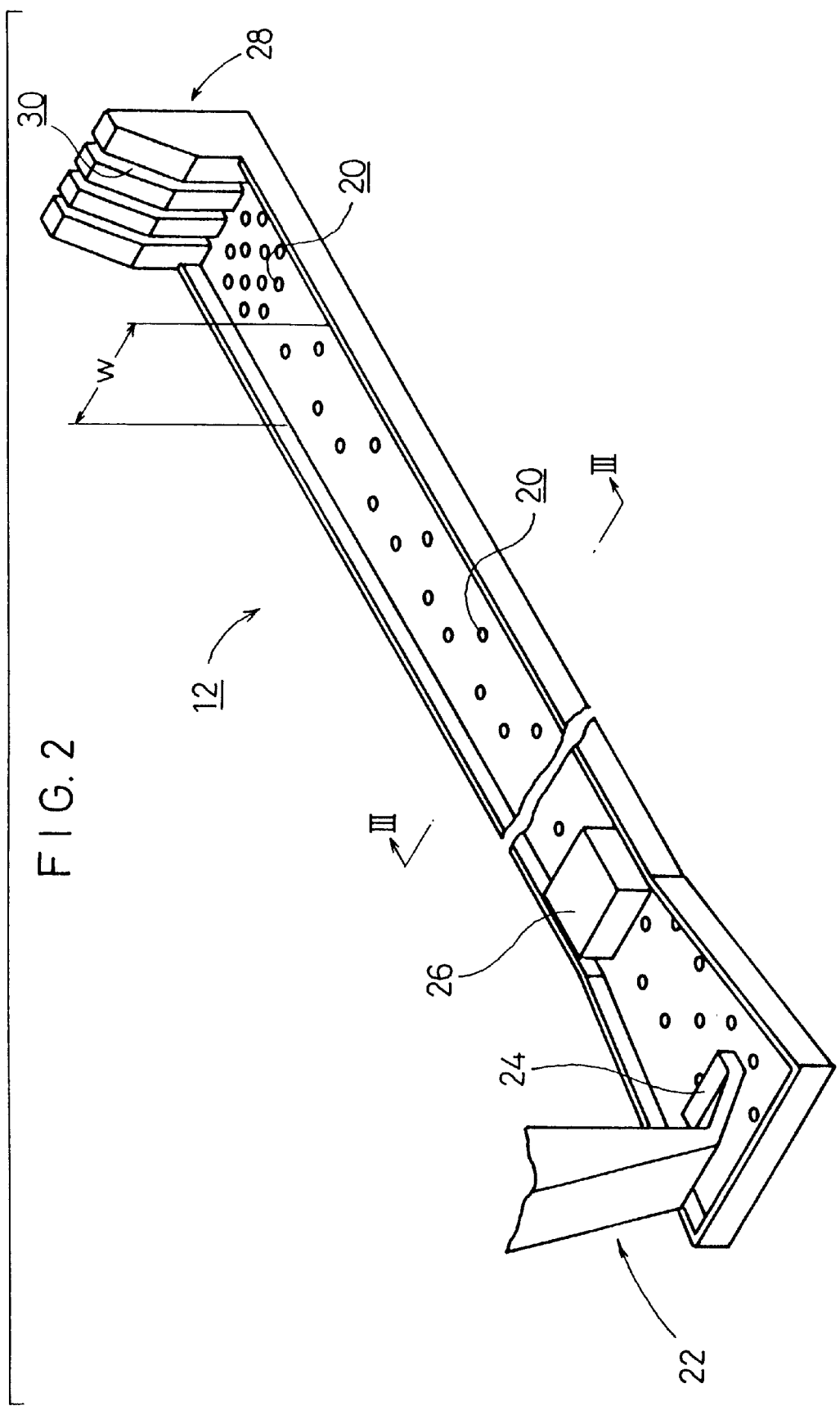
FIG. 2 is a perspective view of a feed path of the article feeding apparatus shown in FIG. 1.

In FIG. 2, the feed path 12 is associated with a mechanism for floating charged semiconductor chips 26, which mechanism is in the form of a plurality of air ejection holes 20 defined vertically in a feed panel of the feed path 12, for ejecting air upwardly therethrough. The feed path 12 is associated with a mechanism (propelling mechanism) for feeding floated semiconductor chips 26 in a feed direction, which mechanism is in the form of an air blowing pipe 22 connected to an air supply system including an air pump and a solenoid-operated valve (not shown). The air blowing pipe 22 has a nozzle 24 mounted on its lower tip end for ejecting air under a pressure of about 0.5 kgf/cm² toward a semiconductor chip 26 on the feed panel. The feed path 12 is also associated with a mechanism for reliably removing semiconductor chips 26 one at a time, which mechanism is in the form of a plurality of air ejection holes 20 defined in the terminal end of the feed path 12, remote from the air blowing pipe 22, for ejecting air therethrough to float one at a time of the semiconductor chips 26, so that the floated semiconductor chip 26 can be attracted under vacuum and smoothly fed by the robot 16b (see FIG. 1). As can be seen from FIG. 2, the air ejection holes 20 defined in the terminal end of the feed path 12 are provided at a greater density than the air ejection holes 20 defined in the remainder of the feed path 12.

An upstanding terminal wall 28 disposed at the terminal end of the feed path 12 has a plurality of parallel vertical slits 30 defined therein. The slits 30 prevent foreign matter from being accumulated against the upstanding terminal wall 28 and hence from being applied to semiconductor chips 26 when they arrive at the terminal end of the feed path 12.

Since the article feeding apparatus 10 is made of a ceramic material, it is prevented from being unduly worn and producing foreign matter as dust particles.

The mechanism (propelling mechanism) for feeding floated semiconductor chips 26 in the feed direction may alternatively comprise means for tilting downwardly the feed path 12 through a predetermined angle with respect to the feed direction. When the feed path 12 is tilted downwardly, floated semiconductor chips 26 are fed by gravity down the feed path 12.

The air ejection holes 20 may be defined obliquely in the feed panel of the feed path 12 for ejecting air upwardly and toward the feed direction therethrough. The air thus ejected from the air ejection holes 20 impart a floating force and a propelling force to semiconductor chips 26 in the feed path 12.

The mechanism for reliably removing semiconductor chips 26 one at a time may alternatively comprise means for designing a planar shape of the feed path 12 in order to maximize the lift of the semiconductor chips 26 near the terminal wall 28. Specifically, the air ejection holes 20 defined in the terminal end of the feed path 12 may be provided at the same density as the air ejection holes 20 defined in the remainder of the feed path 12, and the planar shape of the feed path 12 may be designed to make an amount of air leaking through the gap between a semiconductor chip 26 and the feed path 12 at the terminal end of the feed path 12 smaller than the amount of air leaking through the gap between a semiconductor chip 26 and the feed path 12 in the remainder of the feed path 12.

To prevent foreign matter from being attached to semiconductor chips 26, the terminal wall 28 may have protrusions thereon projecting toward semiconductor chips 26, i.e., upstream in the feed direction, so that the protrusions will be held in point-to-point contact with a semiconductor chip 26 as it arrive at the terminal end of the feed path 12.

Figure 3:
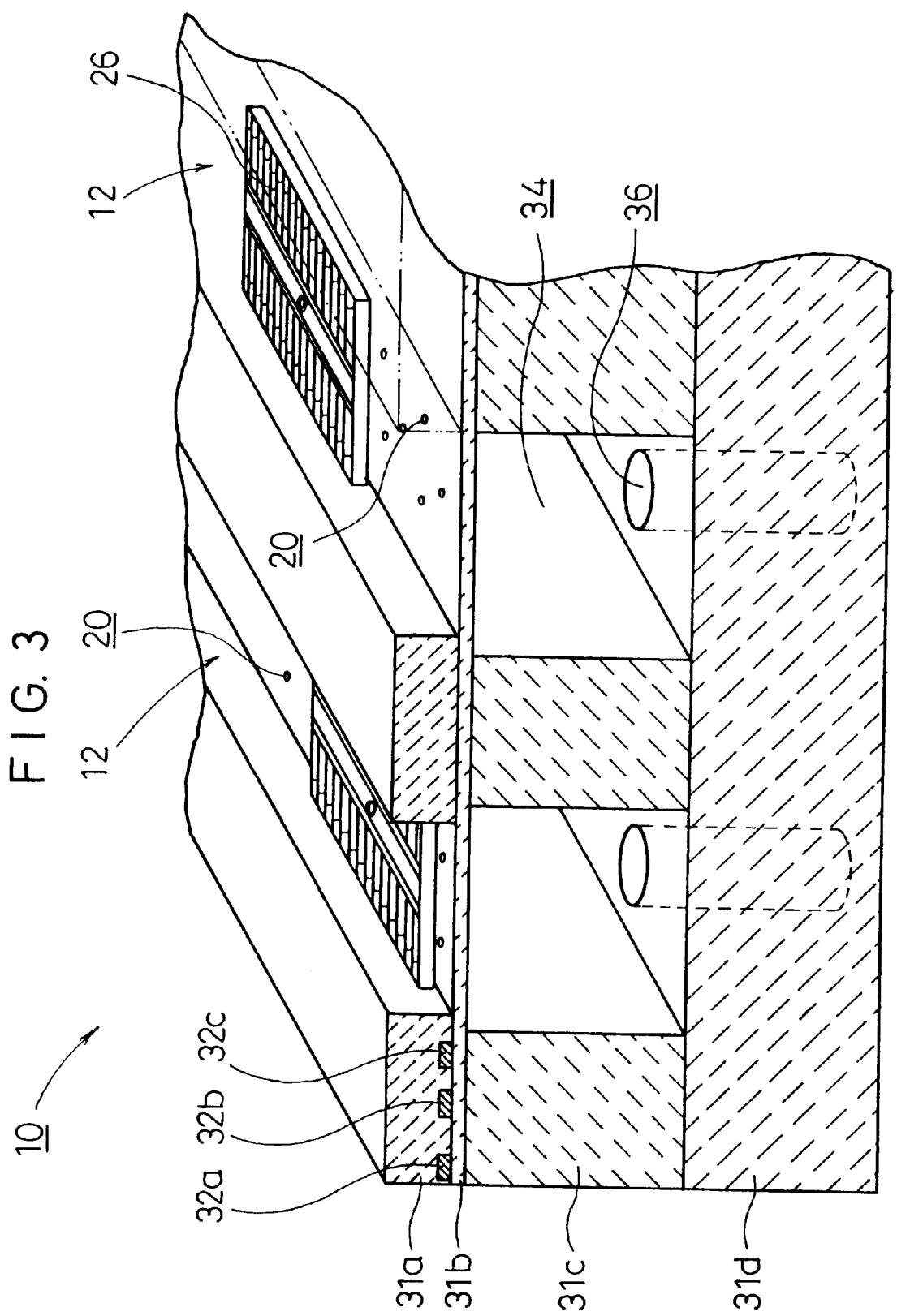
FIG. 3 is a sectional perspective view taken along line III—III of FIG. 2.

As shown in FIG. 3, the structural body of the article feeding apparatus 10 includes first, second, third, and fourth layers 31a, 31b, 31c, 31d successively arranged downwardly. The first through fourth layers 31a14 31d are all made of partially stabilized zirconia. The first through fourth layers 31a–31d may be manufactured either by forming sheets of the ceramic material, integrally joining the sheets, and sintering the joined sheets, or by sintering separate sheets of the ceramic material and bonding the sintered sheets together.

The first layer 31a has a plurality of parallel spaced narrow grooves defined therein as the feed paths 12 by side walls thereof. For example, if each of the semiconductor chips 26 is of a square shape having a size of about 0.2 mm×0.2 mm, then the narrow grooves as the feed paths 12 for feeding such semiconductor chips 26 are defined at a pitch or center-to-center distance of about 0.5 to 0.7 mm, the narrow grooves each having a width (W) ranging from about 0.2 to 0.3 mm. The narrow grooves as the feed paths 12 can be defined with high dimensional accuracy. Since the feed paths 12 are very small in size, therefore, the article feeding apparatus 10 may be small in size.

The second layer 31b, which serves as a bottom wall of each of the feed paths 12, has a number of air ejection holes 20 defined therein, and also has a plurality of electrodes 32a–32c supported thereon which are electrically connected to a piezoelectric body (described later on). Each of the air ejection holes 20 is of a very small diameter, e.g., in the range from 10 to 120 $\mu$m. The electrodes 32a–32c may easily be printed on the second layer 31b. The air ejection holes 20 are preferably provided at such a density that three air ejection holes 20 are assigned to each semiconductor chip 26.

The third layer 31c has a plurality of air distribution passages 34 defined therein for distributing air to the air ejection holes 20 in the second layer 31b. The air distribution passages 34 extend parallel to each other along the feed paths 12 and are connected to respective air supply holes 36 defined in the fourth layer 31d. The third layer 31c may instead have a single air distribution chamber associated with all the feed paths 12.

The fourth layer 31d serves to provide bottom surfaces of the air distribution passages 34. The air supply holes 36 in the fourth layer 31d have upper ends opening into the air distribution passages 34. The air supply holes 36 may be defined in side walls of the third layer 31c, and the fourth layer 31d may be in the form of a sheet with no holes defined therein.

The second layer 31b needs to be made of a ceramic material such as partially stabilized zirconia. However, the third layer 31c and the fourth layer 31d are not limited to the same ceramic material as the second layer 31b though the third layer 31c and the fourth layer 31d which are made of the same ceramic material as the second layer 31b are free of problems such as of warpage or the like due to thermal expansion and shrinkage.

If the electrodes 32a–32c are printed on the second layer 31b and the electrodes 32a–32c are made of a cermet material which comprises a metal such as platinum and a ceramic material such as partially stabilized zirconia diffused in the metal, then the first layer 31a may be made of a ceramic material. If the electrodes 32a–32c are made of a metal such as gold or platinum, then the first layer 31a may be produced by printing a glass material and then sintering the printed glass material or by bonding a synthetic resin. This is because if the first layer 31a were made of a ceramic material, it would melt the metal of the electrodes 32a–32c when the first layer 31a would be sintered.

A stopper mechanism used in the article feeding apparatus 10 will be described below.

Figure 4:
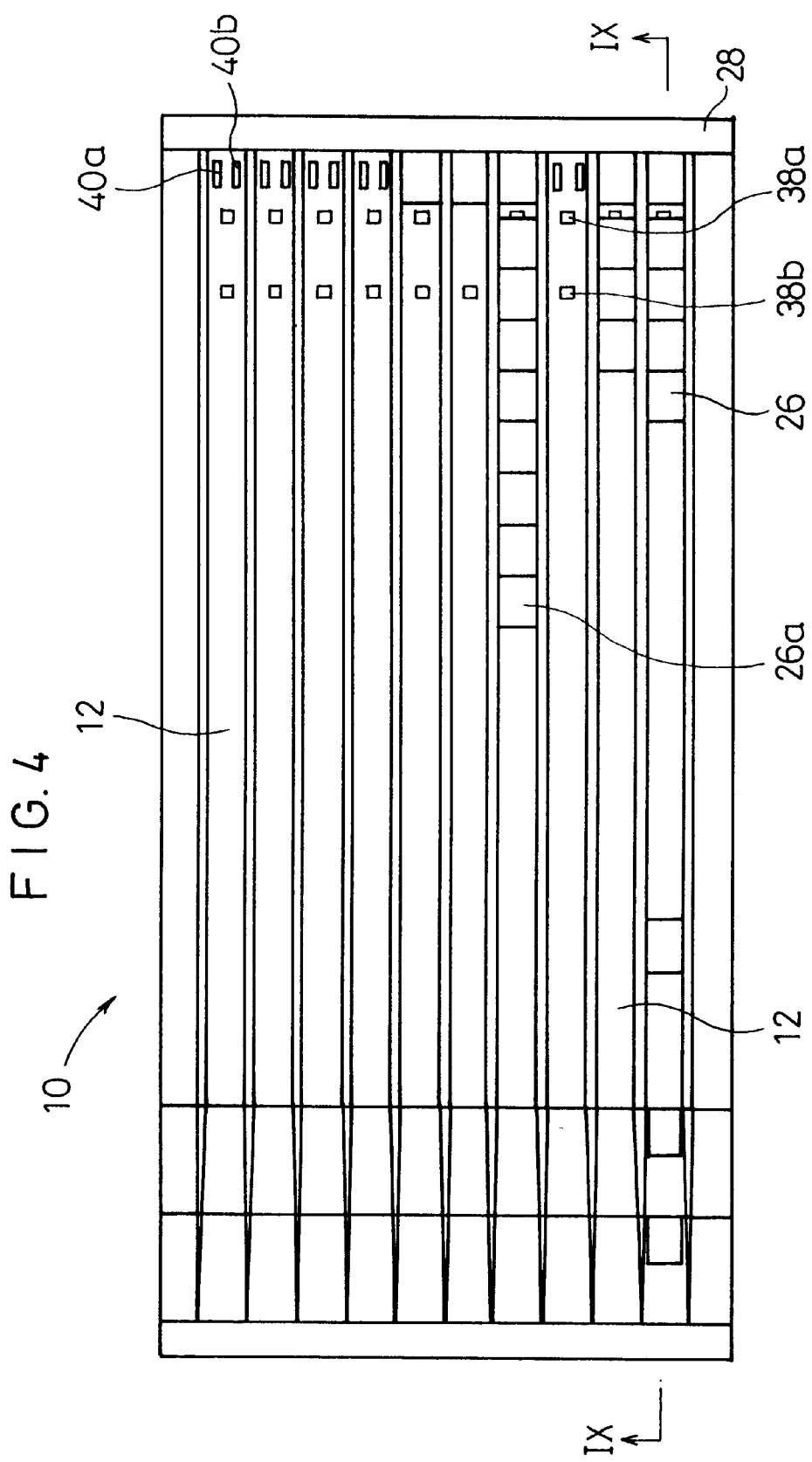
FIG. 4 is a plan view of the article feeding apparatus shown in FIG. 1.

As shown in FIG. 4, the article feeding apparatus 10 has ten grooves as feed paths 12 which correspond respectively to the quality levels of semiconductor chips 26. Semiconductor chips 26 are charged into the article feeding apparatus 10 from a left-hand charging area in FIG. 4, and floated and fed along the feed paths 12 toward their terminal ends at a right-hand area in FIG. 4. Each of the feed paths 12 has a length of about 300 mm, and has first and second piezoelectric bodies 38a, 38b at the terminal end of the feed path 12. The first and second piezoelectric bodies 38a, 38b serve as the stopper mechanism.

Each of the first and second piezoelectric bodies 38a, 38b preferably comprises a film of piezoelectric ceramic material, but may comprise a film of electrostrictive or ferroelectric ceramic material. The ceramic material used may be a material which needs to be either polarized or not. The first and second piezoelectric bodies 38a, 38b are fabricated by printing the above ceramic material on a formed body of the second layer 31b and then sintering the printed ceramic material together with the formed body of the second layer 31b. The ceramic material may be lead zirconate, lead titanate, lead magnesium niobate, nickel lead niobate, lead zinc niobate, or the like, which may be used singly or in combination. Preferably, the first and second piezoelectric bodies 38a, 38b are preferably made mainly of lead zirconate, lead titanate, and lead magnesium niobate because they have a high electromechanical coupling coefficient and a high piezoelectric constant, are less reactive with the material of the article feeding apparatus 10 at the first and second piezoelectric bodies 38a, 38b are sintered, and can stably produce a desired composition.

Figure 5:
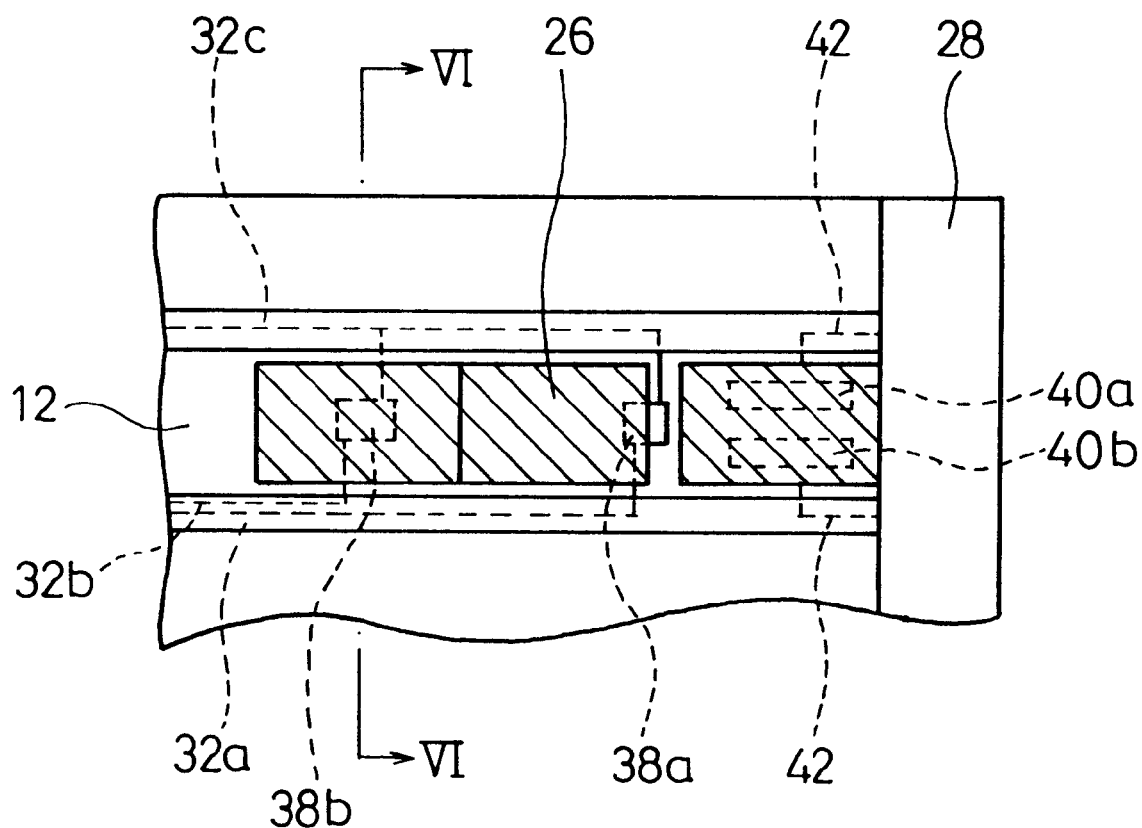
FIG. 5 is an enlarged fragmentary plan view of a region in the vicinity of an end wall of the feed path shown in FIG. 4.

As shown in FIG. 5, the first piezoelectric body 38a is spaced upstream of the terminal wall 28 by a distance which is slightly greater than the size of a semiconductor chip 26, and the second piezoelectric body 38b is spaced upstream of the first piezoelectric body 38a is spaced upstream of the terminal wall 28 by a distance which is slightly greater than the size of a semiconductor chip 26. The second layer 31b supports thereon individual electrodes 32a, 32b and a common electrode 32c which allow the first and second piezoelectric bodies 38a, 38b to form an electric circuit. The electrodes 32a–32c are connected to a DC power supply. The common electrode 32c connected to the first and second piezoelectric bodies 38a, 38b has an upper end held in a position which is about 3–5 µm lower than the height to which the semiconductor chip 26 is floated. Electrodes 40a, 40b of a counter mechanism are disposed in the vicinity of the terminal wall 28. The electrodes 40a, 40b will be described later on.

The electrodes 32a–32c are made of an electrically conductive metal which is solid at normal temperature, such as gold, platinum, iridium, tungsten, tantalum, tin, silver, rhodium, or the like, which may be used singly or in combination. Alternatively, the electrodes 32a–32c may be made of a cermet material which comprises the same ceramic material as the first and second piezoelectric bodies 38a, 38b or the third layer 31b that is diffused in the above material. The electrodes 32a–32c may be sintered of a material of a high melting point together with the first and second piezoelectric bodies 38a, 38b, taking into account the melting point of the material of the first and second piezoelectric bodies 38a, 38b, or may be produced separately after the first and second piezoelectric bodies 38a, 38b have been sintered of a material of a low melting point.

Figure 6:
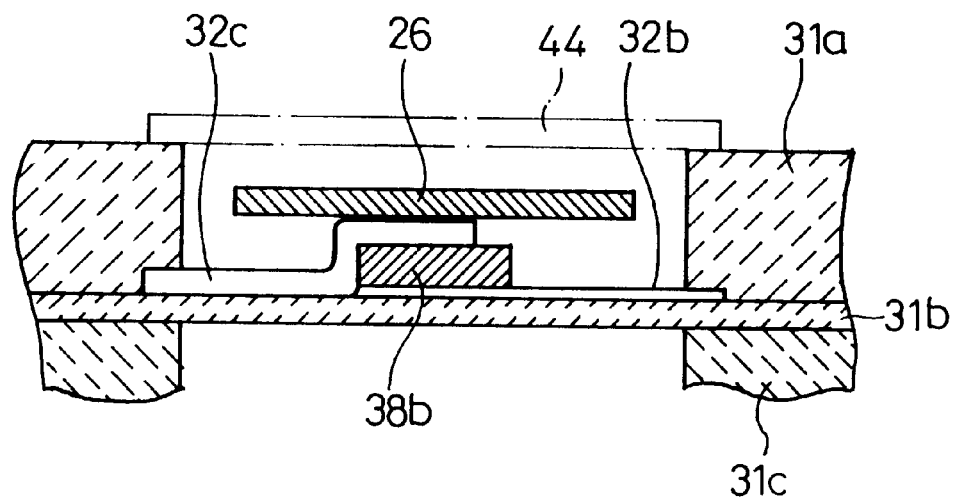
FIG. 6 is a cross-sectional view taken along line IV—IV of FIG. 5.

As shown in FIG. 6, the second piezoelectric body 38b is sandwiched and bonded between the common electrode 32c and the individual electrode 32b. In FIG. 6, the semiconductor chip 26 is fed to a position above the second piezoelectric body 38b. The second layer 31b comprises a thin film having a thickness of about 20 µm, and is sufficiently flexible with opposite ends clamped between the first layer 31a and the third layer 31c.

Figure 7:
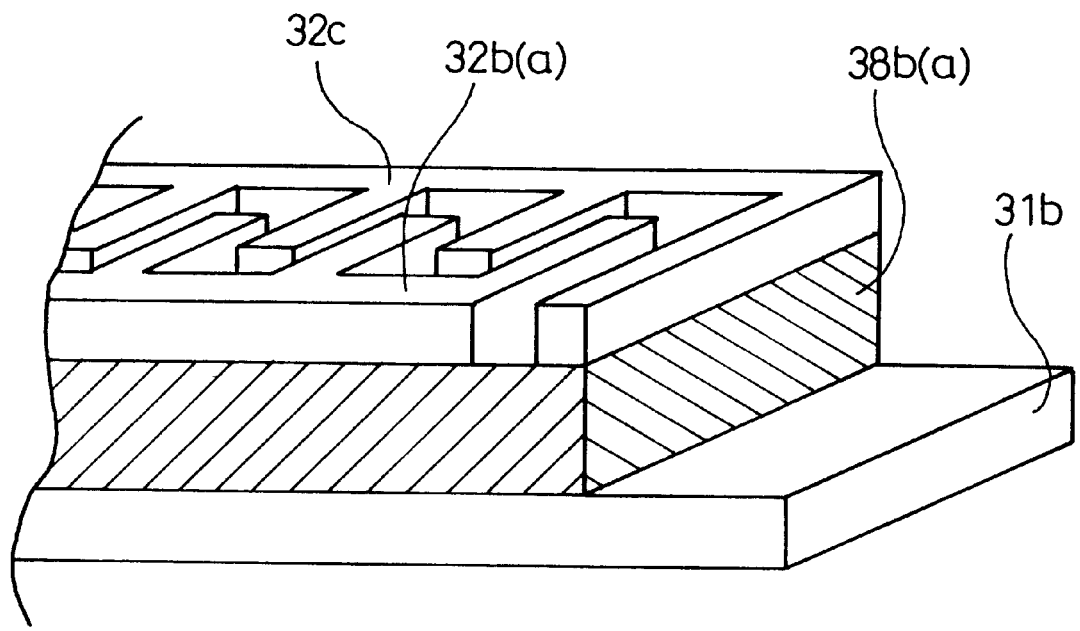
FIG. 7 is a fragmentary perspective view of a piezoelectric body according to a first embodiment.

As shown in FIG. 7, the first and second piezoelectric bodies 38a, 38b may be disposed on the second layer 31b, and the individual electrodes 32a, 32b, which are comb-shaped, and the common electrode 32c, which is also comb-shaped, may be disposed in spaced interdigitating relation to each other on the first and second piezoelectric bodies 38a, 38b.

Figure 8:
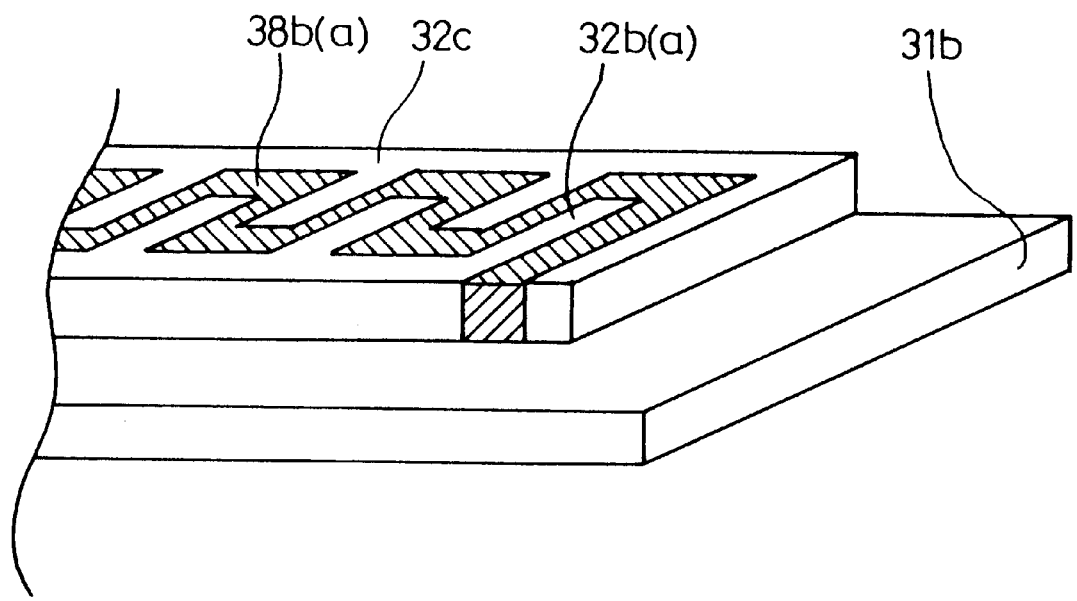
FIG. 8 is a fragmentary perspective view of a piezoelectric body according to a second embodiment.

Alternatively, as shown in FIG. 8, the individual electrodes 32a, 32b, which are comb-shaped, and the common electrode 32c, which is also comb-shaped, may be disposed in spaced interdigitating relation to each other on the second layer 31b, with the first and second piezoelectric bodies 38a, 38b disposed in the gap between the individual electrodes 32a, 32b and the common electrode 32c.

Operation of the stopper mechanism will be described below.

Figure 9:
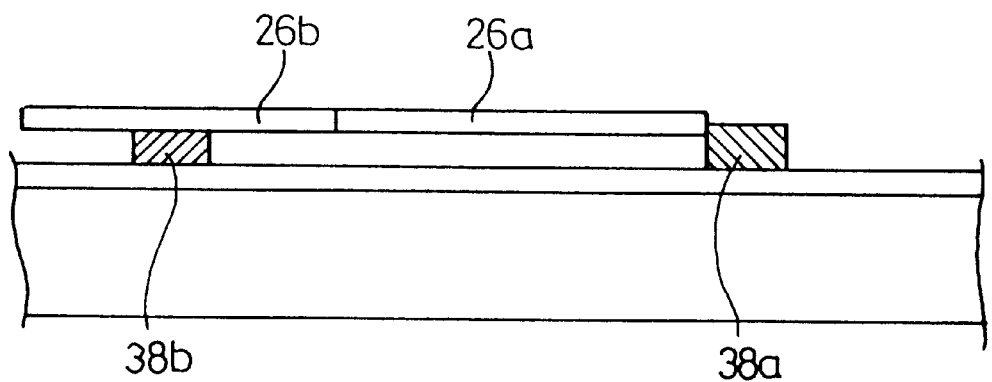
FIG. 9 is a fragmentary cross-sectional view taken along line IX—IX of FIG. 4.

As shown in FIG. 9, when a voltage is applied to the first piezoelectric body 38a, it is mechanically deformed into a barrier having an increased height in the feed path. When a floated semiconductor chip 26a collides with the barrier, the semiconductor chip 26a which has traveled to a position near the terminal end of the feed path is temporarily stopped. Then, the applied voltage is removed, allowing the first piezoelectric body 38a to return to an original height thereof slightly lower than the height of the floated semiconductor chip 26a. The stopped semiconductor chip 26a. is now permitted to travel further downstream to an unloading position at the terminal end of the feed path. After the semiconductor chip 26a. has been fed to the unloading position, a voltage is applied again to the first piezoelectric body 38a to stop a next semiconductor chip 26b. The above cycle of operation will subsequently be repeated.

When the first piezoelectric body 38a returns to the original height, permitting the semiconductor chip 26a to travel further downstream to the unloading position, a voltage is applied to the second piezoelectric body 38b to impose frictional forces on the surface of the next semiconductor chip 26b which is in contact with the second piezoelectric body 38b thereby to decelerate and stop the semiconductor chip 26b for preventing the semiconductor chip 26b from being directly fed to the unloading position and hence overlapping the semiconductor chip 26a. Therefore, whereas a voltage is repeatedly applied and removed from the first piezoelectric body 38a in certain periodic cycles, a voltage is applied to the second piezoelectric body 38b during periods of time in which no voltage is applied to the first piezoelectric body 38a and marginal periods before and after those periods of time. Since the second layer 31b on which the first and second piezoelectric bodies 38a, 38b are mounted is sufficiently flexible, when voltages are applied to the first and second piezoelectric bodies 38a, 38b, the first and second piezoelectric bodies 38a, 38b are allowed to be deformed effectively without being unduly constrained by the second layer 31b.

For reliably allowing the first and second piezoelectric bodies 38a, 38b to operate reliably as described above, the original thickness (height) of the first and second piezoelectric bodies 38a, 38b should preferably be in the range from about 10 to 30 µm. The surface of the second piezoelectric body 38b should preferably be coated with highly wear-resistant glass or resin film for increasing frictional forces exerted thereby to the semiconductor chip 26b.

The counter mechanism in the article feeding apparatus 10 will be described below.

The counter mechanism is positioned in alignment with the first piezoelectric body 38a or the second piezoelectric body 38b in each of the feed paths 12. As shown in FIGS. 4 and 5, the electrodes 40a, 40b of the counter mechanism are disposed at the terminal end of each of the feed paths 12 near the terminal wall 28 and transversely spaced from each other. The electrodes 40a, 40b are electrically connected to respective conductors 42.

Alternatively, as shown in FIG. 6, the common electrode 32c may be used as one of the electrodes of the counter mechanism, and an electrode 44 may be mounted on the first layer 31*a* over the common electrode 32*c* for use as the other electrode of the counter mechanism. With this arrangement, some of the existing electrodes and circuit may be used as part of the counter mechanism. Further alternatively, as shown in FIG. 4, the electrodes of the counter mechanism may be located at an intermediate position in each of the feed paths 12, e.g., at the ninth semiconductor chip 26, as counted upstream (away from the terminal wall 28) from the terminal end of each of the feed paths 12, of a series of nine semiconductor chips 26 staying in the feed path 12.

The electrodes 40*a*, 40*b* of the counter mechanism may be made of the same material and may be manufactured in the same manner as the electrodes 32*a*–32*c* connected to the first and second piezoelectric bodies 38*a*, 38*b*, or may not be limited to the same material as the electrodes 32*a*–32*c*, but may be made of any of various ordinary electrically conductive materials.

The electrodes 40*a*, 40*b* of the counter mechanism operate as follows:

A voltage is continuously applied between the electrodes 40*a*, 40*b*. When no semiconductor chip 26 is present on the electrodes 40*a*, 40*b*, a capacitor with air serving as a dielectric medium is connected between the electrodes 40*a*, 40*b*, and a voltage $V_1$ is detected between the conductors 42. When a semiconductor chip 26 is fed to a position near the terminal wall 28, i.e., over the electrodes 40*a*, 40*b*, as shown in FIG. 5, a capacitor with the semiconductor chip 26 serving as a dielectric medium is connected between the electrodes 40*a*, 40*b*, and a voltage $V_2$ which is lower than the voltage $V_1$ is detected between the conductors 42. The voltage between the conductors 42 is continuously detected by a circuit (not shown) of the counter mechanism to count the number of times that the detected voltage varies, and the counter number can be recognized as the number of semiconductor chips 26 that have been fed to the position near the terminal wall 28.

Since one at a time of semiconductor chips 26 is reliably fed to the position near the terminal wall 28 by the stopper mechanism, semiconductor chips 26 are prevented from unduly overlapping each other or being joined to each other at position near the terminal wall 28. Consequently, the number of fed semiconductor chips 26 can reliably be counted by the counter mechanism. Using the count information from the counter mechanism, it is possible to control the rate at which semiconductor chips 26 are fed down the feed paths 12 for automatizing the article feeding apparatus 10.

If the electrodes of the counter mechanism are be located at an intermediate position in each of the feed paths 12, as described above, then the counter mechanism may be used as a sensor for detecting when a certain number of semiconductor chips 26 remain stagnant between the unloading position at the terminal end of the feed path 12 and the intermediate position.

Although certain preferred embodiments of the present invention have been shown and described in detail, it should be understood that various changes and modifications may be made therein without departing from the scope of the appended claims.

What is claimed is:

1. An apparatus which gas feeds electronic parts, comprising:

a structural body having grooves which serve respectively as parallel feed paths for electronic parts, said feed paths corresponding to respective quality levels of the electronic parts, said structural body being made of partially stabilized zirconia;

a stopper mechanism for temporarily stopping electronic parts fed along said feed paths, said stopper mechanism comprising piezoelectric bodies disposed in said feed paths in front of terminal walls of the feed paths; and a counter mechanism for counting electronic parts fed along said feed paths, said counter mechanism having electrodes disposed in said feed paths near said terminal walls.

* * * * *